US006803719B1

United States Patent
Miller et al.

(10) Patent No.: US 6,803,719 B1
(45) Date of Patent: Oct. 12, 2004

(54) QUANTUM DOT WHITE AND COLORED LIGHT-EMITTING DEVICES

(75) Inventors: Jeffrey N. Miller, Los Altos Hills, CA (US); Ronald L. Moon, Atherton, CA (US); Moungi E. Bawendi, Boston, MA (US); Jason Heine, Cambridge, MA (US); Klavs F. Jensen, Lincoln, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/350,956

(22) Filed: Jul. 9, 1999

Related U.S. Application Data

(63) Continuation-in-part of application No. 09/167,795, filed on Oct. 7, 1998, now Pat. No. 6,501,091.
(60) Provisional application No. 60/092,120, filed on Apr. 1, 1998.

(51) Int. Cl.[7] ............................. H01L 33/00; H01J 1/62
(52) U.S. Cl. ...................... 313/501; 313/502; 313/503; 257/89; 257/98; 257/100
(58) Field of Search ............................. 257/88, 89, 98, 257/100, 99; 313/501–503

(56) References Cited

U.S. PATENT DOCUMENTS

| | | | | |
|---|---|---|---|---|
| 5,260,957 A | * | 11/1993 | Hakimi et al. | 372/39 |
| 6,252,254 B1 | * | 6/2001 | Soules et al. | 257/89 |
| 6,322,901 B1 | * | 11/2001 | Bawendi et al. | 428/548 |

* cited by examiner

*Primary Examiner*—Minh-Loan Tran
(74) *Attorney, Agent, or Firm*—Choate, Hall & Stewart

(57) ABSTRACT

A light-emitting device comprising a population of quantum dots (QDs) embedded in a host matrix and a primary light source which causes the QDs to emit secondary light and method of making such a device. The size distribution of the QDs is chosen to allow light of a particular color to be emitted therefrom. The light emitted from the device may be of either a pure (monochromatic) color, or a mixed (polychromatic) color, and may consist solely of light emitted from the QDs themselves, or of a mixture of light emitted from the QDs and light emitted from the primary source. The QDs desirably are composed of an undoped semiconductor such as CdSe, and may optionally be overcoated to increase photoluminescence.

56 Claims, 4 Drawing Sheets

(1 of 4 Drawing Sheet(s) Filed in Color)

QUANTUM DOT WHITE AND COLORED LIGHT-EMITTING DEVICES

This application is a continuation-in-part of U.S. application Ser. No. 09/167,795, filed Oct. 7, 1998, now U.S. Pat. No. 6,501,091, which claims benefit of U.S. Provisional Application No. 60/092,120, filed Apr. 1, 1998, the disclosures of which are incorporated herein by reference in their entirety.

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyrights whatsoever.

This invention was made with government support under Contract Number 94-00034 awarded by the National Science Foundation. The government has certain rights in the invention.

FIELD OF THE INVENTION

The present invention relates to the use of quantum dots in light-emitting devices. The invention further relates to light-emitting devices that emit light of a tailored spectrum of frequencies. In particular, the invention relates to a light-emitting device, wherein the device is a light-emitting diode.

BACKGROUND OF THE INVENTION

Light-emitting devices, in particular, light-emitting diodes (LEDs), are ubiquitous to modern display technology. More than 30 billion chips are produced each year and new applications, such as automobile lights and traffic signals, continue to grow. Conventional devices are made from inorganic compound semiconductors, typically AlGaAs (red), AlGaInP (orange-yellow-green), and AlGaInN (green-blue). These devices emit monochromatic light of a frequency corresponding to the band gap of the compound semiconductor used in the device. Thus, conventional LEDs cannot emit white light, or indeed, light of any "mixed" color, which is composed of a mixture of frequencies. Further, producing an LED even of a particular desired "pure" single-frequency color can be difficult, since excellent control of semiconductor chemistry is required.

Light-emitting devices of mixed colors, and particularly white LEDs, have many potential applications. Consumers would prefer white light in many displays currently having red or green light-emitting devices. White light-emitting devices could be used as light sources with existing color filter technology to produce full color displays. Moreover, the use of white LEDs could lead to lower cost and simpler fabrication than red-green-blue LED technology.

White LEDs are currently made by combining a blue LED with a yellow phosphor to produce white light. However, color control is poor with this technology, since the colors of the LED and the phosphor cannot be varied. This technology also cannot be used to produce light of other mixed colors.

It has been proposed to manufacture white or colored light-emitting devices by combining various derivatives of photoluminescent polymers such as poly(phenylene vinylene) (PPVs). One device that has been proposed involves a PPV coating over a blue GaN LED, where the light from the light-emitting device stimulates emission in the characteristic color of the PPV, so that the observed light is composed of a mixture of the characteristic colors of the device and the PPV. However, the maximum theoretical quantum yield for PPV-based devices is 25%, and the color control is often poor, since organic materials tend to fluoresce in rather wide spectra. Furthermore, PPVs are rather difficult to manufacture reliably, since they are degraded by light, oxygen, and water. Related approaches use blue GaN-based LEDs coated with a thin film of organic dyes, but efficiencies are low (see, for example, Guha et al. (1997) *J. Appl. Phys.* 82(8):4126–4128; *III-Vs Review* 10(1):4, 1997).

It has also been proposed to produce light-emitting devices of varying colors by the use of quantum dots (QDs). Mattoussi et al. (1998) *J. Appl. Phys.* 83:7965–7974; Nakamura et al. (1998) *Electronics Lett.* 34:2435–2436; Schlamp et al. (1997) *J. Appl. Phys.* 82:5837–5842; Colvin et al. (1994) *Nature* 370:354–357. Semiconductor nanocrystallites (i.e., QDs) whose radii are smaller than the bulk exciton Bohr radius constitute a class of materials intermediate between molecular and bulk forms of matter. Quantum confinement of both the electron and hole in all three dimensions leads to an increase in the effective band gap of the material with decreasing crystallite size. Consequently, both the optical absorption and emission of QDs shift to the blue (higher energies) as the size of the QDs gets smaller. It has been found that a CdSe QD, for example, can emit light in any monochromatic color, in which the particular color characteristic of the light emitted is dependent only on the QD's size.

Currently available light-emitting diodes and related devices that incorporate quantum dots use QDs that have been grown epitaxially on a semiconductor layer. This fabrication technique is most suitable for the production of infrared light-emitting devices, but devices in higher-energy colors have not been achieved by this method. Further, the processing costs of epitaxial growth by currently available methods (molecular beam epitaxy and chemical vapor deposition) are quite high. Colloidal production of QDs is a much more inexpensive process, but QDs produced by this method have generally been found to exhibit low quantum efficiencies, and thus have not previously been considered suitable for incorporation into light-emitting devices.

A few proposals have been made for embedding colloidally produced QDs in an electrically conductive layer in order to take advantage of the electroluminescence of these QDs for a light-emitting device. Mattoussi et al. (1998), supra; Nakamura et al. (1998), supra; Schlamp et al. (1997), supra; Colvin et al. (1994), supra. However, such devices require a transparent, electrically conductive host matrix, which severely limits the available materials for producing devices by this method. Available host matrix materials are often themselves light-emitting, which may limit the achievable colors using this method.

SUMMARY OF THE INVENTION

In one aspect, this invention comprises a device, comprising a light source and a population of QDs disposed in a host matrix. The QDs are characterized by a band gap energy smaller than the energy of at least a portion of the light from the light source. The matrix is disposed in a configuration that allows light from the source to pass therethrough. When the QD disposed in the host matrix is irradiated by light from the source, that light causes the QDs to photoluminesce secondary light. The color of the secondary light is a function of the size, size distribution and composition of the QDs.

In one embodiment of this aspect, the QDs comprise a core of CdS, CdSe, CdTe, ZnS, ZnSe, ZnTe, GaAs, GaP, GaAs, GaSb, HgS, HgSe, HgTe, InAs, InP, InSb, AlAs, AlP, AlSb, an alloy thereof, or a mixture thereof, and are, optionally overcoated with a shell material comprising ZnO, ZnS, ZnSe, ZnTe, CdO, CdS, CdSe, CdTe, MgS, MgSe, GaAs, GaN, GaP, GaAs, GaSb, HgO, HgS, HgSe, HgTe, InAs, InN, InP, InSb, AlAs, AlN, AlP, AlSb, an alloy thereof, or a mixture thereof. Preferably, the band gap energy of the overcoating is greater than that of the core. The core or core-shell QD may be further coated with a material having an affinity for the host matrix. The host matrix may be any polymer, such as polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxies, silica glass, silica gel, siloxane, polyphosphate, hydrogel, agarose, cellulose, and the like. The primary light source may be a light-emitting diode, a laser, an arc lamp or a black-body light source. The color of the device is determined by the size, size distribution and composition of the QDs. The size distribution may be a random, gradient, monomodal or multimodal and may exhibit one or more narrow peaks. The QDs, for example, may be selected to have no more than a 10% rms deviation in the diameter of the QDs. The light may be of a pure color, or a mixed color, including white.

In a related aspect, the invention comprises a method of producing a device as described above. In this method, a population of QDs is provided, and these QDs are dispersed in a host matrix. A light source is then provided to illuminate the QDs, thereby causing them to photoluminesce light of a color characteristic of their size, size distribution and composition. The QDs may be colloidally produced (i.e., by precipitation and/or growth from solution), and may comprise a core of CdS, CdSe, CdTe, ZnS, ZnSe, ZnTe, GaAs, GaP, GaAs, GaSb, HgS, HgSe, HgTe, InAs, InP, InSb, AlAs, AlP, AlSb, an alloy thereof, or a mixture thereof. The QDs are, optionally, overcoated with a shell material comprising ZnS, ZnSe, ZnTe, CdS, CdSe, CdTe, MgS, MgSe, GaAs, GaP, GaAs, GaSb, HgS, HgSe, HgTe, InAs, InP, InSb, AlAs, AlP, AlSb, an alloy thereof, or a mixture thereof. The host matrix may be any material in which QDs may be dispersed in a configuration in which they may be illuminated by the primary light source. Some examples of host matrix materials include polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxies, silica glass, silica gel, siloxane, polyphosphate, hydrogel, agarose, cellulose, and the like. Any light source capable of causing the QDs to photoluminesce may be used; some examples are light-emitting diodes, lasers, arc lamps and black-body light sources.

It may be desirable to tailor the size distribution of the QDs of a particular core composition to tailor the color of light which is produced by the device. In one embodiment, referred to herein as a "monodisperse size distribution," the QDs exhibit no more than a 10% rms deviation in diameter. The light may be of a pure color using a monodisperse size distribution of QDs or of a mixed color using a polydisperse size distribution of QDs, including white.

In a further aspect, the invention comprises a QD composition, in which QDs are disposed in a host matrix. The QDs are, optionally, coated with a material having an affinity for the host matrix. When illuminated by a source of light of a higher energy than the band gap energy of the QDs, the QDs photoluminesce in a color characteristic of their size, size distribution and composition.

In one embodiment, the QDs comprise a core of CdS, CdSe, CdTe, ZnS, ZnSe, ZnTe, GaAs, GaP, GaAs, GaSb, HgS, HgSe, HgTe, InAs, InP, InSb, AlAs, AlP, AlSb, an alloy thereof, or a mixture thereof, and are, optionally overcoated with a shell material comprising ZnO, ZnS, ZnSe, ZnTe, CdO, CdS, CdSe, CdTe, MgS, MgSe, GaAs, GaN, GaP, GaAs, GaSb, HgO, HgS, HgSe, HgTe, InAs, InN, InP, InSb, AlAs, AlN, AlP, AlSb, an alloy thereof, or a mixture thereof. The host matrix may be a polymer such as polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxies, silica glass, silica gel, siloxane, polyphosphate, hydrogel, agarose, cellulose, and the like. In one embodiment, the QDs are coated with a monomer related to a polymer component of the host matrix. The QDs may be selected to have a size distribution exhibiting an rms deviation in diameter of less than 10%; this embodiment will cause the QDs to photoluminesce in a pure color.

A related aspect of the invention comprises a prepolymer composition comprising a liquid or semisolid precursor material, with a population of QDs disposed therein. The composition is capable of being reacted, for example by polymerization, to form a solid, transparent or translucent host matrix, i.e., a host matrix that allows light to pass therethrough. Optionally, the QDs are coated with a material having an affinity for the precursor material or with a prepolymeric material. For example, if the prepolymer composition forms a polyacrylate upon polymerization, the QD can be coated with an acrylate monomer which, optionally, allows the QD to become incorporated into the backbone structure of the polymer. The precursor material may be a monomer, which can be reacted to form a polymer. The QDs may comprise a core of CdS, CdSe, CdTe, ZnS, ZnSe, ZnTe, GaAs, GaP, GaAs, GaSb, HgS, HgSe, HgTe, InAs, InP, InSb, AlAs, AlP, AlSb, an alloy thereof, or a mixture thereof, and are, optionally, overcoated with a shell material comprising ZnO, ZnS, ZnSe, ZnTe, CdO, CdS, CdSe, CdTe, MgS, MgSe, GaAs, GaN, GaP, GaAs, GaSb, HgO, HgS, HgSe, HgTe, InAs, InN, InP, InSb, AlAs, AlN, AlP, AlSb, an alloy thereof, or a mixture thereof. The QDs may be selected to have a size distribution having an rms deviation in diameter of less than 10%.

In yet another aspect, the invention comprises a method of producing light of a selected color. The method comprises the steps of providing a population of QDs disposed in a host matrix, and irradiating the QDs in the host matrix with a source of light having an energy higher than the band gap energy of a QD in the host matrix such that the QDs are caused to photoluminesce. The QDs may comprise a core of CdS, CdSe, CdTe, ZnS, ZnSe, ZnTe, GaAs, GaP, GaAs, GaSb, HgS, HgSe, HgTe, InAs, InP, InSb, AlAs, AlP, AlSb, an alloy thereof, or a mixture thereof, and are, optionally overcoated with shell material comprising ZnO, ZnS, ZnSe, ZnTe, CdO, CdS, CdSe, CdTe, MgS, MgSe, GaAs, GaN, GaP, GaAs, GaSb, HgO, HgS, HgSe, HgTe, InAs, InN, InP, InSb, AlAs, AlN, AlP, AlSb, an alloy thereof, or a mixture thereof. The host matrix may comprise polymers such as polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxies, silica glass, silica gel, siloxane, polyphosphate, hydrogel, agarose, cellulose, and the like.

The host matrix containing the QDs may be formed by reacting a precursor material having QDs disposed therein (for example by polymerization or physically entrapping). Alternatively, two or more precursor materials may be provided, each having QDs of a different sizes, size distributions and/or compositions disposed therein. These precursors may be mixed and reacted to form a host matrix, or alternatively, they may be layered to form a host matrix having different sizes, size distributions and/or compositions of QDs in different layers.

BRIEF DESCRIPTION OF THE DRAWING

The file of this patent contains at least one drawing executed in color. Copies of this patent with color drawings(s) will be provided by the Patent and Trademark Office upon request and payment of the necessary fee.

The invention is described with reference to the several figures of the drawing, which are presented for the purpose of illustration only, and in which.

DETAILED DESCRIPTION

The practice of the present invention will employ, unless otherwise indicated, conventional methods of chemistry within the skill of the art. Such techniques are explained fully in the literature.

As used in this specification and the appended claims, the singular forms "a," "an" and "the" include plural references unless the content clearly dictates otherwise. Thus, for example, reference to "a quantum dot" includes a mixture of two or more such quantum dots, a "layer" includes more than one such layer, and the like.

In describing the present invention, the following terms will be employed, and are intended to be defined as indicated below.

The term "quantum dot" or "QD" as used herein is intended to encompass a core nanocrystal, an overcoated core ("core-shell") nanocrystal, a coated core-shell nanocrystal or a coated core, unless the context clearly indicates otherwise.

The phrase "colloidally grown" quantum dots is used herein to refer to QDs which have been produced by precipitation and/or growth from a solution. A distinction between these QDs and quantum dots epitaxially grown on a substrate is that colloidally grown QDs have a substantially uniform surface energy, while epitaxially grown QDs usually have different surface energies on the face in contact with the substrate and on the remainder of the QD surface.

As used herein, the terms "pure" or "monochromatic" color refers to a color which is composed of light of a narrow distribution of wavelengths having a spectral width between about 10–100 nm, preferably between about 10–50 nm, and more preferably about 10–30 nm. A "mixed" or "polychromatic" color refers to a color which is composed of light of a mixture of different monochromatic colors.

The term "monomer" is intended to refer to a substance that can be polymerized according to techniques known in the art of materials science, and may include oligomers. A "related monomer" of a polymer is a component monomer of the polymer, or a compound capable of being incorporated into the backbone of the polymer chain.

The term "affinity" is meant to describe the adherence between a QD with a coat material and a host matrix. The adherence may comprise any sort of bond including, but not limited to, covalent, ionic, or hydrogen bonding, Van der Waals' forces, or mechanical bonding, or the like.

"Optional" or "optionally" means that the subsequently described event or circumstance may or may not occur, and that the description includes instances where the event or circumstance occurs and instances in which it does not. For example, the phrase "optionally overcoated with a shell material" means that the overcoating referred to may or may not be present in order to fall within the scope of the invention, and that the description includes both presence and absence of such overcoating.

Figure 1:
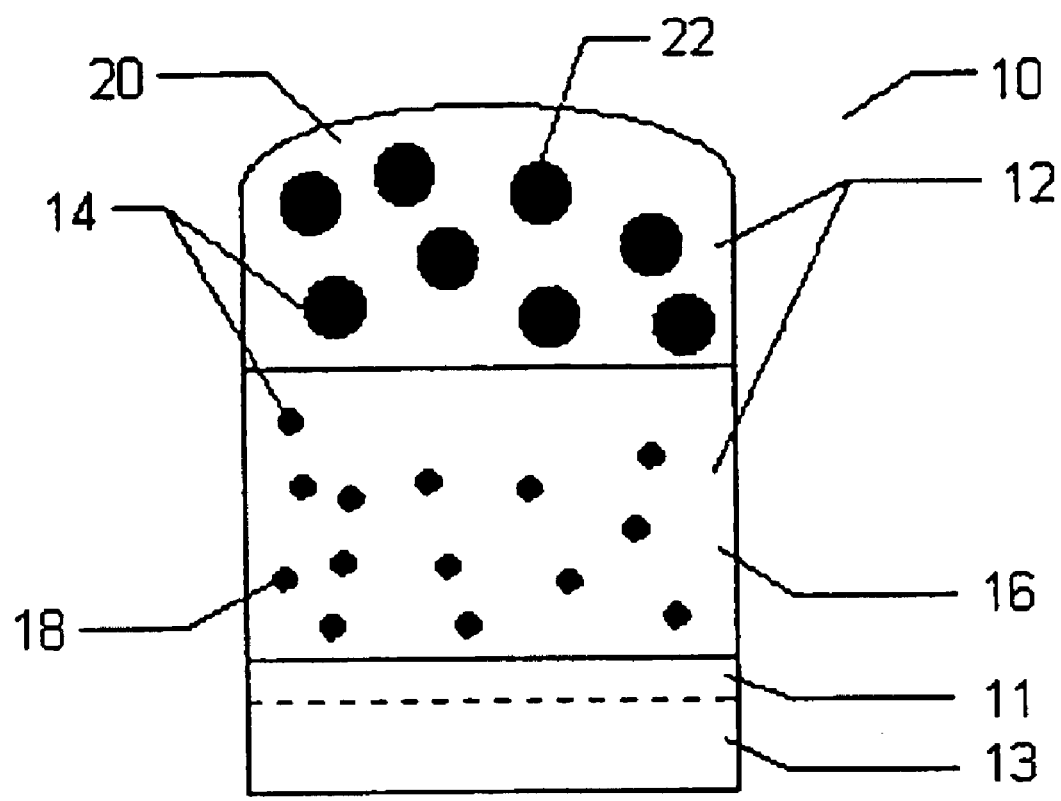
FIG. 1 represents one embodiment of a light-emitting device according to the invention.
Figure 2:
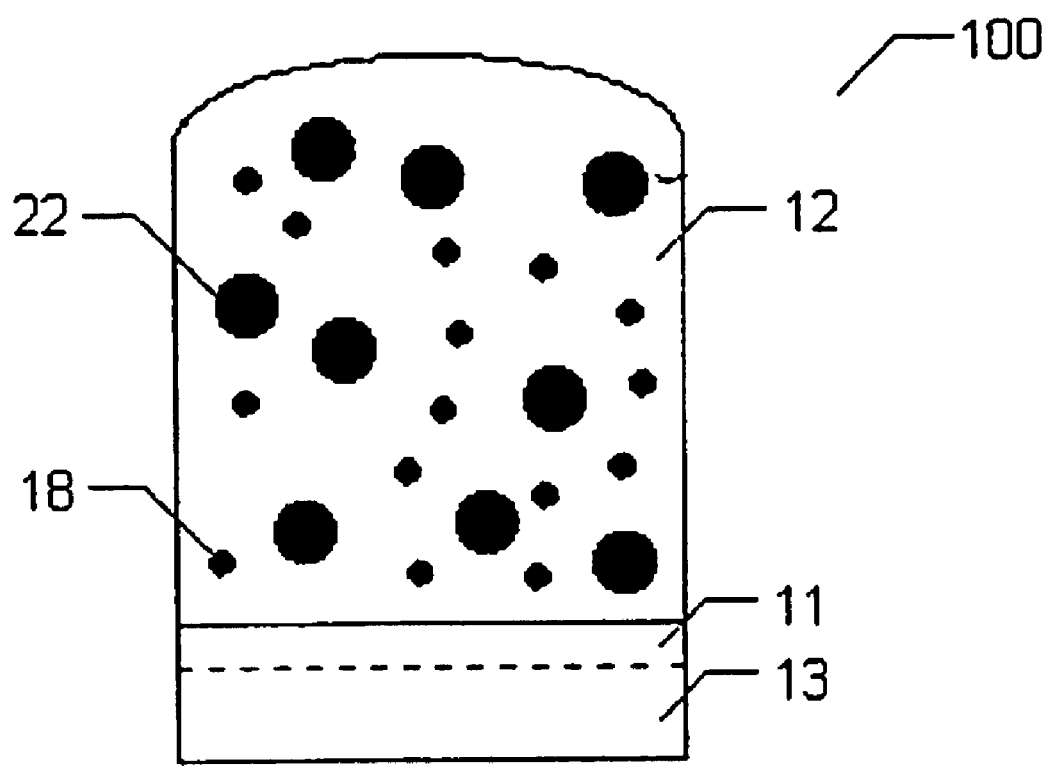
FIG. 2 represents another embodiment of a light-emitting device according to the invention.

Light-emitting devices of almost any color visible to the human eye can be produced by the techniques of the current invention using a single undoped semiconductor material for the QDs. Embodiments of the invention are illustrated in FIGS. 1 and 2, and indicated generally at 10 and 100, respectively. In general terms, the invention comprises a primary light source 13, for example a light-emitting diode, a laser, an arc lamp or a black-body light source. The primary light source 13 is desirably chosen so that its energy spectrum includes light of higher energies than the desired device color energy emitted by the QDs. The primary light source is disposed so as to irradiate a host matrix 12 containing a population of QDs 14. The primary light source is in optical communication with the host matrix. In one embodiment, primary light source 13 is in physical contact with the host matrix. Optionally, a medium 11 is interposed between host matrix 12 and primary light source 13. Medium 11 may be a medium transparent or translucent to or conductive of at least a portion of the light emitted from primary light source 13, e.g., air, a vacuum, a polymer, a glass, a liquid or the like. The interposition of medium 11 between primary light source 13 and host matrix 12 can result in the light source being physically separate from the host matrix.

Host matrix 12 may be any material in which QDs can be disposed and that is at least partially transparent or translucent to, i.e., allows light to pass therethrough, or conductive of light from primary light source 13; examples of suitable host matrices are discussed further below. The host matrix 12 desirably contains a dispersion of QDs 14, wherein the size, size distribution and/or composition of the QDs has been selected to produce light of a given color. Other configurations of QDs disposed in a host matrix, such as, for example, a two-dimensional layer on a substrate with a polymer overcoating, are also contemplated within the scope of the invention. Techniques for producing QDs that fluoresce in a narrow spectral distribution of a selected color are discussed further below and in Dabbousi et al. (1997) *J. Phys. Chem. B* 101:9463–9475 and in copending U.S. patent application Ser. No. 08/969,302, "Highly Luminescent Color Selective Materials," Bawendi et al, filed Nov. 13, 1997; such techniques allow particularly fine color control of the final light-emitting device. However, other techniques for producing QDs and disposing them in a host matrix are also encompassed within the scope of the invention.

The primary light source 13 and the size, size distribution and composition of the QDs 12 are chosen in such a way that the radiation emitted from the device is of the desired color. The invention may be constructed with a density of QDs such that substantially all light from the primary source is absorbed by the QDs and the radiation emitted from the device is produced principally by photoluminescence of the QDs. Alternatively, the invention may be constructed with a lower density of QDs such that the light emitted from the device is a mixture of unabsorbed primary light and of secondary light produced by photoluminescence of the QDs. A very wide range of both pure and mixed colors can be produced by a device constructed according to the principles of the invention.

Figure 4:
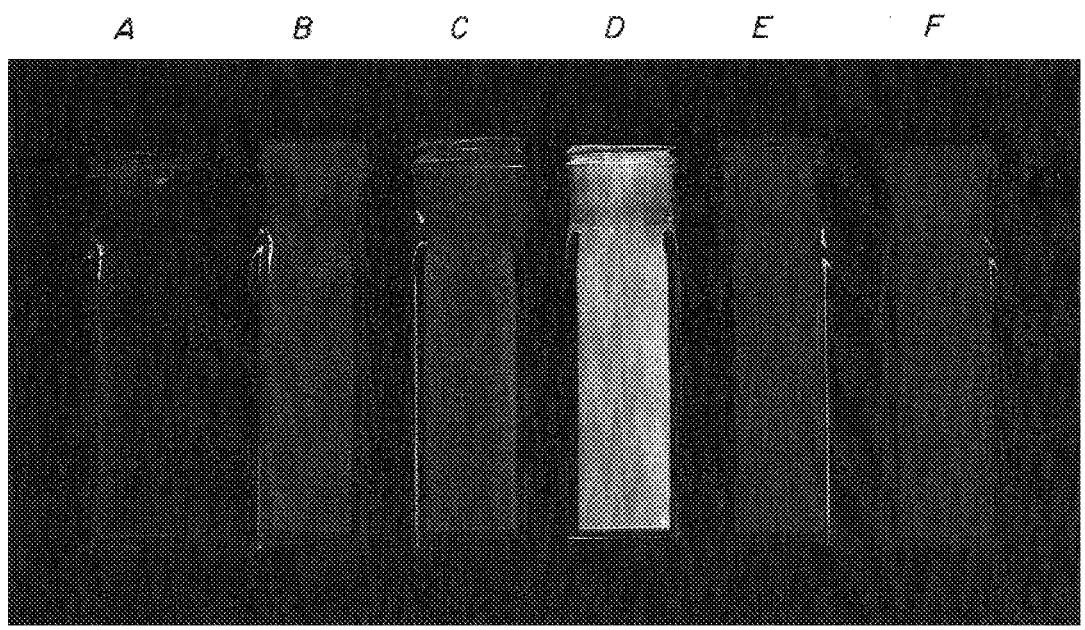
FIG. 4 is a color photograph of several suspensions of QDs in hexane, illustrating the wide range of colors that can be achieved by the methods and devices of the invention.

For example, CdSe QDs can be produced that emit colors visible to the human eye, so that in combination with a source of higher energy than the highest energy of the desired color, these QDs can be tailored to produce visible light of any spectral distribution. FIG. 4 shows several suspensions of CdSe QDs made according to the method of Dabbousi et al., supra, and U.S. application Ser. No. 08/969, 302, supra, and illustrates the very wide range of colors which can be achieved using the photoluminescence of these materials. The maxima of the photoluminescent peaks in these solutions are (from left to right) (a) 470 nm, (b) 480 nm, (c) 520 nm, (d) 560 nm, (e) 594 nm, and (f) 620 nm. The solutions are being irradiated by an ultraviolet lamp emitting 356 nm ultraviolet light.

QDs can also be produced that emit in the ultraviolet and infra red spectral ranges. Examples of ultraviolet- and infrared-emitting QDs are, e.g., CdS, ZnS and ZnSe, and InAs, CdTe and MgTe, respectively. Such UV and IR emitters can also be incorporated into the device disclosed and claimed herein.

It is usually desirable that the QDs be isolated from each other within the host matrix, particularly when the device is intended to emit light of a mixed color. For example, when two QDs of different sizes are in close contact, the larger QD, which has a lower characteristic emission energy, will tend to absorb a large fraction of the emissions of the smaller QD, and the overall energy efficiency of the device will be reduced, while the color will shift towards the red.

In one particular embodiment of the invention, a white light-emitting device is provided. Such a device may be produced by combining a combination of sizes of photoluminescent QDs with a standard blue primary light source. Referring to FIG. 1, the device, generally indicated at 10, comprises a blue light source 13, for example an LED of the AlGaInN type, to provide primary light. This light passes through a layer or layers comprising QDs that luminesce in a lower-energy range than the blue LED embedded in a polymeric matrix. In the embodiment shown in FIG. 1, the primary light first passes through a layer 16 of QDs 18 of a material and size adapted to emit red secondary light. The primary light which has not been absorbed by the first layer and the secondary light then pass through a second layer 20 of QDs 22 of a material and size adapted to emit green secondary light. Once the light has passed through this second layer, it will be composed of a mix of unabsorbed blue primary light, green secondary light, and red secondary light, and hence will appear white to the observer. The relative amplitudes of the red, green, and blue components of the light can be controlled by varying the thickness and QD densities of the red and green layers to produce a light-emitting device of a desired color.

In another preferred embodiment, the red-emitting QDs 22 and green-emitting QDs 18 can be mixed in a common matrix 12, as shown in FIG. 2. The color can be controlled by varying the relative densities of the different sizes and compositions of QDs and the thickness of the layer.

Figure 3:
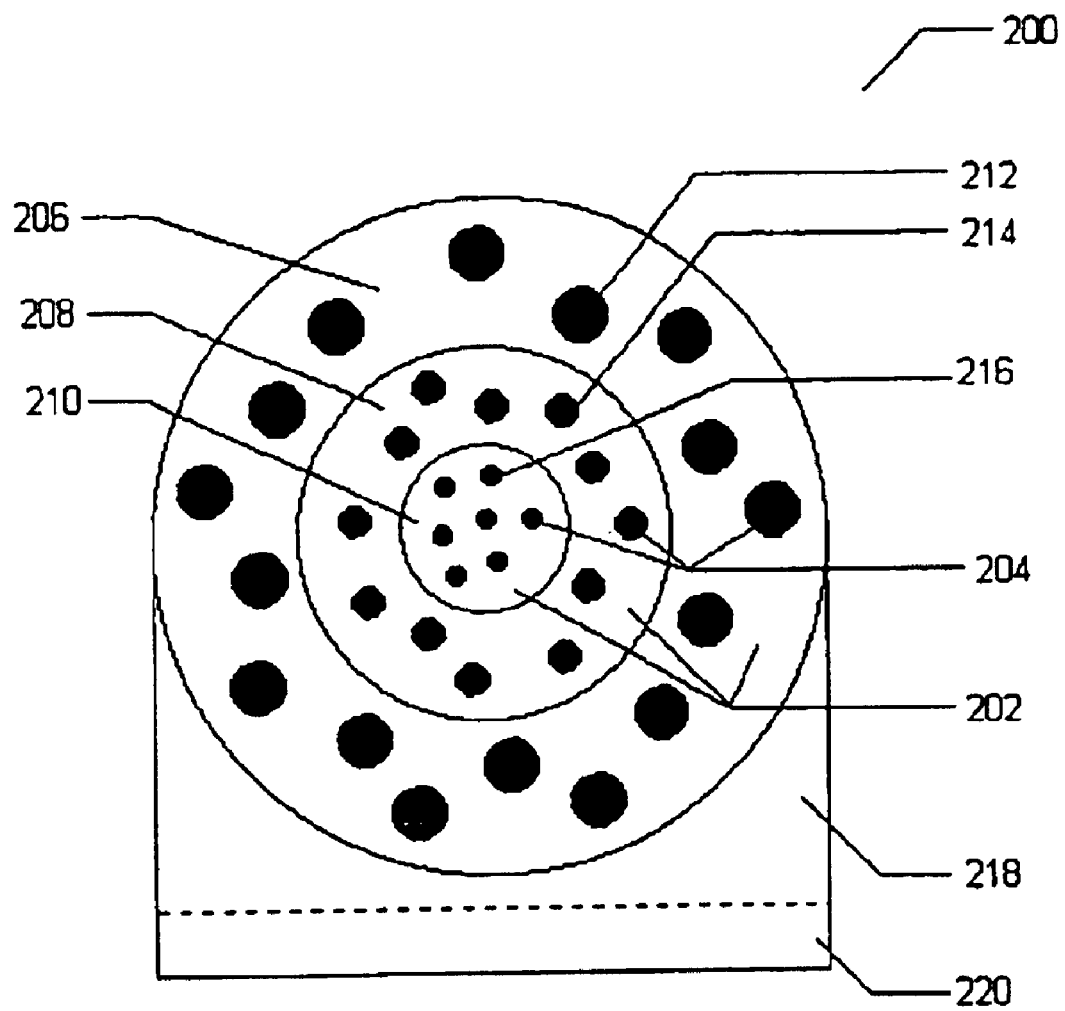
FIG. 3 represents yet another embodiment of a light-emitting device according to the invention.

In yet another preferred embodiment, layers of host matrix containing QDs can be formed in a concentric conformation, e.g., a spherical or cylindrical conformation, as illustrated in FIG. 3. Indicated generally at 200, the device comprises layers of host matrix 202, in which are dispersed QDs 204, and primary light source 220. Inner layer 210 is prepared, for example, by providing a precursor material having disposed therein a QD 216 having a size, size distribution, composition, or combination thereof, selected to emit in a predetermined spectral range. The precursor material is reacted, e.g., polymerized, to form host matrix 210 having QDs 216 dispersed therein. These steps are repeated as often as desired with the same or different precursor material having disposed therein QDs of the same or different size, size distribution, composition or combination thereof to form layers of host matrix 208 and 206 having disposed therein QDs 214 and 212, respectively, surrounding host matrix 210. If desired, a the QDs may be omitted from any layer. Primary light source 220 is disposed to be in optical communication with the layers of host matrix 202 so as to irradiate the QDs 204 disposed therein. In one embodiment, primary light source 220 is in physical contact with the host matrix. Optionally, medium 218, as described above, is interposed between the layers of host matrix 202 and primary light source 220. When the host matrix is conformed as a cylinder, the primary light source can be disposed to irradiate the QDs in the host matrix from the base or the side of the cylinder.

In still another embodiment, the primary light source may be a light source such as a laser or a UV light source. In this embodiment, the QD layer(s) may comprise QDs emitting in a spectral range ranging from infrared to violet. By controlling the size, size distribution and composition of the QDs, the spectral distribution of the resulting light may be controlled.

When it is desired to produce a light-emitting device that emits a particular color, rather than a white light-emitting device, this also may be accomplished by the practice of the invention. Although the invention is expected to be particularly useful for the manufacture of a light-emitting device that produces polychromatic light (mixed colors), which are difficult to produce by traditional methods, light-emitting devices that produce monochromatic light (pure colors) may also be prepared by the practice of the invention. This may be desirable for purposes of ease of manufacturing, since substantially the same set of equipment is required to produce light-emitting devices of almost any visible color, whether pure or mixed.

The perception of color by the human eye is well understood, and formulae for mixing pure colors to produce any desired mixed color can be found in a number of handbooks. The color of light produced by a particular size and composition of QD may also be readily calculated or measured by methods which will be apparent to those skilled in the art. As an example of these measurement techniques, the band gaps for QDs of CdSe of sizes ranging from 12 Å to 115 Å are given in Murray et al. (1993) *J. Am. Chem. Soc.* 115:8706. These techniques allow ready calculation of an appropriate size, size distribution and composition of QDs and choice of primary light source to produce a light-emitting device of any desired color.

When a white light-emitting device, e.g., a white LED, is desired, an appropriate mix of QD sizes may be used. A white light which appears "clean" to the observer may be achieved, for example, by tailoring the spectral distribution to match a black body distribution, e.g., as would be produced by a resistive lamp.

When a colored device, such as a blue AlGaInN LED, is used as the primary light source, the color of the light generated by that device may or may not be included in the final spectrum produced by the device according to the invention, depending on the density of the QDs and the path length of the light. If a sufficiently high density of QDs is provided, the QDs will absorb substantially all of the primary light, and only secondary light in the characteristic colors of the QDs will be observed. If a lower density of QDs is provided, a significant quantity of primary light may be mixed with the secondary light emitted by the QDs.

The host matrix will typically be a solid or liquid material which is at least sufficiently transparent or translucent so that light emitted by the QDs can be detected and in which QDs can be dispersed. For example, the host matrix can be a polymer, an epoxy, a silica glass, a silica gel, or a solvent, but any suitable material may serve as the host matrix. The host matrix can be any material that is at least partially transparent or translucent to or conductive of light from the primary light source. An advantage of the present invention compared to light-emitting devices based on electroluminescence of QDs, rather than photoluminescence, is that in the present invention the host matrix need not be electrically conductive. Electroluminescent QD LEDs require a transparent, electrically conductive material to serve as the host matrix. Such materials are rare, compared to the very large number of transparent or translucent materials available for use with the present invention that are not necessarily conductive. Suitable host matrix materials for the devices described herein include many inexpensive and commonly available materials, such as polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxies, silica glass, silica gel, siloxane, polyphosphate, hydrogel, agarose, cellulose, and the like.

A further advantage of the present invention is the manufacturing flexibility afforded by the use of multiple populations of QDs to achieve both pure and mixed colors of light. "Stock" solutions of different sizes, size distributions and compositions of QDs suspended in a monomer or other precursor material can be maintained, and mixed in varying amounts to produce almost any desired color. For example, three suspensions of CdSe QDs in a liquid monomer such as styrene could be produced: a first suspension of QDs of approximately 5.5 nm diameter (which will luminesce in the red), a second suspension of QDs of approximately 4.0 nm diameter (which will luminesce in the green), and a third suspension of QDs of approximately 2.3 nm diameter (which will luminesce in the blue). These suspensions function as a kind of "light paint"; by varying the amounts of these three suspensions, and polymerizing the resulting mixture, light-emitting devices of a very wide range of colors can be produced using the same manufacturing techniques, varying only the starting materials.

Preferably, colloidally produced QDs are coated such that they can be dispersed in the host matrix without flocculation. In the case of dispersal in a polymeric host matrix, use of a related monomer with a pendent moiety possessing affinity for the QD's surface has been found to allow good mixing of QDs into a polymer matrix. Particular cases of this type of coating may be found in the Examples. In the case of dispersal in a prepolymer host matrix, use of a related monomer with a pendent moiety possessing affinity for the QD's surface has been found to allow good mixing into a monomer solution for subsequent polymerization to form the host matrix. Particular cases of this type of coating may be found in the Examples. In the case of dispersal into a silica glass or gel, any coating that will bind at one end to the QD, and the other end of which has an affinity for the matrix, may be used. The coating may be applied directly to the surface of the QD or as a coating to an overcoated QD.

A number of methods of producing QDs are known in the art. Any method of producing QDs that will fluoresce with a desired spectrum may be used in the practice of the invention. Preferably, the methods described in Dabbousi et al., supra, and U.S. application Ser. No. 08/969,302, supra, can be used to produce QDs useful in devices as disclosed and claimed herein. Dabbousi et al., supra, discloses a method that can be used for overcoating QDs composed of CdS, CdSe, or CdTe with ZnS, ZnSe, or mixtures thereof. Before overcoating, the QDs are prepared by a method described in Murray et al., supra, that yields a substantially monodisperse size distribution. An overcoat of a controlled thickness can then be applied by controlling the duration and temperature of growth of the coating layer. The monodispersity of the core QDs results in monochromatic emission. The overcoated QDs, optionally, have improved quantum efficiency and emit more light than unovercoated QDs.

The above method can be used to prepare separate populations of QDs, wherein each population exhibits a different characteristic photoluminescence spectrum. By mixing populations so prepared, a device that fluoresces in any desired mixed color, including white, may be produced. The overcoating on the QDs allows the device to produce more light than would be possible using unovercoated QDs.

Below are examples of specific embodiments of the present invention. The examples are offered for illustrative purposes only, and are not intended to limit the scope of the present invention in any way.

Efforts have been made to ensure accuracy with respect to numbers used (e.g., amounts, temperatures, etc.), but some experimental error and deviation should, of course, be allowed for.

EXAMPLE 1

ODs in Polystyrene

A green light-emitting device has been constructed according to the principles of the invention described above. The QDs used to construct this device were composed of a CdSe core and a ZnS overcoating. The absorption and luminescence properties of the QDs were primarily determined by the size of the CdSe core. The ZnS shell acted to confine electrons and holes in the core and to electronically and chemically passivate the QD surface. Both the core and shell were synthesized using wet chemistry techniques involving formation of CdSe or ZnS from precursors added to a hot organic liquid as described below. CdSe core synthesis 16 ml of trioctylphosphine (TOP), 4 ml of 1 M trioctylphosphine selenide (TOPSe) in TOP, and 0.2 ml dimethylcadmium were mixed in an inert atmosphere (nitrogen-filled glovebox). 30 g of trioctylphosphine oxide (TOPO) was dried under vacuum at 180° C. for 1 hour, and then heated to 350° C. under nitrogen. The precursor solution was then injected into the TOPO. The temperature immediately fell to about 260° C. and CdSe nanocrystals immediately formed. The absorption peak of the nanocrystals immediately after injection was found to be around 470 nm. The temperature was held at 250–260° C. for about 10–15 minutes, allowing the nanocrystals to grow. During this time, the absorption peak shifted from 470 nm to 490 nm. The temperature was then dropped to 80° C. and held with the solution under nitrogen. The heat was removed and about 15 ml butanol was added to prevent solidification of the TOPO as it cooled to room temperature. This process produced $12 \times 10^4$ moles (12 μmoles) of CdSe QDs.

The UV-Vis absorption spectrum of the CdSe nanocrystals showed a first transition peak at 486 nm with a halfwidth half-max (HWHM) measured on the red side of the peak, of 14 nm. This absorption peak corresponded to a nanocrystal radius of 13 Å, The actual size distribution can be determined experimentally via small angle x-ray scattering or TEM. The absorption spectrum gave a rough estimate of the size distribution. The 14 nm HWHM suggested a size distribution with a HWHM of about 1 Å.

ZnS Shell Synthesis

The CdSe core solution (15 ml; 2.22 μmoles) was used to produce the overcoated QDs. The nanocrystals were precipitated out of the solution by slowly adding 40–50 ml of methanol. The precipitate was then redispersed in hexane and filtered with 0.2 micron filter paper. 40 g of TOPO was dried as described above and then cooled to 80° C. The nanocrystals in hexane were injected into the TOPO, and the hexane was evaporated under vacuum for 2 hours. A ZnS precursor solution was then prepared in an inert atmosphere by mixing 4 ml of TOP, 0.28 ml of diethylzinc, and 0.56 ml of bis-trimethylsilyl sulfide $(TMSi)_2S$. The amounts of precursor were chosen to produce a ZnS shell thickness of about 9 angstroms, which corresponds to 4 monolayers at 2.3 angstroms/monolayer. The nanocrystal/TOPO solution was then heated to 140° C., and the precursor solution was added over 4 minutes. The temperature was then reduced to 100° C. and held at that temperature for at least two hours. Heat was removed and butanol added to prevent solidification of the TOPO.

The UV-Vis absorption spectrum of the overcoated QDs showed the first transition peak at 504 nm with a HWHM measured on the red side of the peak of 20 nm. The photoluminescence peak was at 520 nm.

Dispersal of QDs in Polymer

ZnS-overcoated QDs were dispersed in poly(styrene) as follows. ZnS-overcoated QDs (0.44 μmoles CdSe QDs) in TOPO/butanol were precipitated and then dispersed in hexane as described above. Hexane was evaporated under vacuum from an aliquot containing 0.09 μmoles QDs. The QDs were redispersed in 0.1 ml of toluene. n-Functionalized, amine-terminated polystyrene (molecular weight=2600; 0.05 g) was dissolved in 0.2 ml toluene. 0.05 ml of toluene solution containing QDs (0.04 μmotes CdSe QDs) and 0.05 ml functionalized polystyrene in toluene (about 0.01 g) were mixed together and sonicated for about 10 minutes. A solution of 1 g polystyrene (molecular weight=45,000) in 1 ml of toluene was prepared. 0.1 ml of this concentrated polystyrene solution (about 0.05 g polystyrene) was added to the QD/functionalized-polystyrene solution. The resulting solution was sonicated for 2 minutes to thoroughly mix, the QDs and polystyrene.

Production of Diode

The blue diode used as a primary light source was GaN based and had a luminescence peak at 450 nm. The glass cap was a shortened, thin-walled glass tube (OD=5 mm, ID=4.3 mm, length=3/16"). The glass cap was filled with the QD/polymer solution and allowed to dry under flowing nitrogen for over two hours. More QD/polymer solution could be added and dried as needed, but only one filling and drying step was needed for this diode. When dried, the polymer left a void at the base of the cap. The emitting portion of the blue diode was then placed in this void at the base of the cap. The polymer itself did not contact the diode. Green light was produced as the blue light from the GaN caused the QDs to luminesce at 520 nm. The 520 nm light gave the device a green appearance.

EXAMPLE 2

ODs in an Epoxy Polymer Matrix

CdSe/ZnS QDs having a 14 Å core radius were prepared as described in Example 1. 0.01 μmoles of QDs in TOPO solution were taken, and the QDs were precipitated and washed 2 times with methanol. The QDs were then redispersed in 0.27 ml (2 mmoles) of a capping monomer, 6-mercaptohexanol. In order to effectively disperse the QDs in the capping monomer, the solutions were first sonicated for about 10 minutes and then stirred for 2 hours at 50–60° C.

The QD solution was then further reacted with epoxide monomers. 0.56 ml (2 mmoles) of poly[(phenyl glycidylether)-co-formaldehyde] (number average molecular weight=345) and 0.08 ml (0.8 mmoles) of diethyltriamine were added to the 6-mercaptohexanol solution. The resulting mixture was thoroughly mixed and placed in a glass tube having an outside diameter of 6 mm and a length of 50 mm. Air bubbles formed during mixing were removed by sonicating for 10 minutes. The glass tube containing the monomer mixture was then heated to 70° C. in an oil bath for 2 hours, forming a high molecular weight epoxy with the QDs distributed therein. This formed composite could then be used as described in Example 1 with a primary light source to make a green LED.

EXAMPLE 3

ODs in a Methacrylate Polymer Matrix

CdSe/ZnS QDs having core radii of 13, 15, 18, 21, 23, 29, and 34 Å were prepared as described in Example 1. Solutions of between 0.01–0.05 μmoles of each diameter of QD in TOPO were precipitated and washed with methanol 2 times. 50–100 μl (100–200 μmoles) of trioctylphosphine, freshly removed from a nitrogen-atmosphere glove box, were then added to each QD precipitate. 650 μl of lauryl methacrylate (Sigma-Aldrich, 96%, 2.2 mmoles) was added to each QD-trioctylphosphine solution and stirred for 2 minutes. Approximately 350 μl of 1,6-hexanediol dimethacrylate (Polysciences, 98%, 1.2 mmoles) was added to each lauryl methacrylate solution and stirred for another 2 minutes to form a monomer solution of each different diameter QD. 10–20 mg of azobisisobutylonitrile (AIBN, 1% w/w) was then added to each monomer solution. The resulting mixtures were individually mixed thoroughly and placed in glass tubes having an outer diameter of 6 mm, an inner diameter of approximately 4.5 mm, and a length of 50 mm. In a separate experiment, blue gallium nitride LED primary light sources (Nichia, NSPB300A, epoxy-polymer encapsulated) were dipped into each of the monomer solutions until the monomer solution completely covered the diode head.

Each of these two types of devices was then placed in an oven, preheated at 70° C., for approximately 2 hours. Care was taken to avoid disturbing the monomer mixture during polymerization. After 2 hours, the monomer was completely polymerized, i.e., it was firm on contact and it was resistant to deformation under applied pressure. For the polymerized specimens without the LEDs, the glass tubes were scored with a file and broken to yield polymerized QD-composite plastic sticks that emitted blue, blue-green, green, yellow, orange, red, or deep red light under UV excitation. The LED-containing specimens emitted in the same colors, with the exception of blue, under excitation by the blue LED.

Mixed colored and white emitters can be constructed by mixing different monomer solutions having different core radii CdSe QDs in them. Surprisingly, polymerization does not reduce the quantum yields of the QDs, so the final color emitted by these mixed QD-polymer composites is of the same energy and intensity as the initial mixture of monomer solutions.

Other embodiments of the invention will be apparent to those skilled in the art from a consideration of the specification or practice of the invention disclosed herein. It is intended that the specification and example be considered as exemplary only, with the true scope and spirit of the invention being indicated by the following claims.

What is claimed is:

1. A device comprising:
    a primary light source; and
    a population of photoluminescent quantum dots (QDs) disposed in a host matrix,
    wherein:
        each QD of the population comprises a core of an independently selected size and composition, and the population comprises a selected size distribution of QDs;
        at least a portion of the QDs have a band gap energy smaller than the energy of at least a portion of the light produced by the light source; and
        the matrix is in optical communication with the light source and is disposed so as to allow the light to pass therethrough, thereby causing the QDs to photoluminesce light of a color characteristic of the size, size distribution, composition, or combination thereof, wherein the matrix allows both light from the light source and photoluminesced light to pass therethrough.

2. The device of claim 1, wherein the host matrix is transparent to photoluminescent light emitted by the QDs.

3. The device of claim 1, wherein the host matrix is transparent to light produced by the light source and to photoluminescent light emitted by the QDs.

4. The device of claim 1, wherein the core of each QD comprises a material independently selected from the group consisting of CdS, CdSe, CdTe, ZnS, ZnSe, ZnTe, GaAs, GaP, GaAs, GaSb, HgS, HgSe, HgTe, InAs, InP, InSb, AlAs, AlP, AlSb, alloys thereof, and mixtures thereof.

5. The device of claim 4, wherein the QDs further comprise a core overcoat comprising a material independently selected from the group consisting of ZnO, ZnS, ZnSe, ZnTe, CdO, CdS, CdSe, CdTe, MgS, MgSe, GaAs, GaN, GaP, GaAs, GaSb, HgO, HgS, HgSe, HgTe, InAs, InN, InP, InSb, AlAs, AlN, AlP, AlSb, alloys thereof, and mixtures thereof.

6. The device of claim 5, wherein the overcoated core further comprises a coat having an affinity for the host matrix.

7. The device of claim 1, wherein the primary light source is in physical contact with the host matrix.

8. The device of claim 1, further comprising a medium interposed between the primary light source and the host matrix.

9. The device of claim 1, wherein the host matrix comprises at least one material selected from the group consisting of liquids, polymers, epoxies, silica glasses, and silica gels.

10. The device of claim 1, wherein the host matrix comprises at least one polymer selected from the group consisting of polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxies, silica glass, silica gel, siloxane, polyphosphate, hydrogel, agarose, and cellulose.

11. The device of claim 1, wherein the QDs further comprise a core coat comprising a material having an affinity for the host matrix.

12. The device of claim 11, wherein the host matrix comprises a polymer and the coat material comprises a related monomer.

13. The device of claim 1, wherein the primary light source is selected from the group consisting of a light-emitting diode, a laser, an arc lamp and a black-body light source.

14. The device of claim 1, wherein the population of QDs has a size distribution having less than a 10% rms deviation in diameter of the core.

15. A composition comprising a population of quantum dots (QDs) dispersed without substantial flocculation in a host matrix, wherein each QD of the population comprises a core of an independently selected size and composition and the population comprises a selected size distribution of QDs, and further wherein the QDs are selected to photoluminesce light when QDs in the host matrix are irradiated with light from a primary source whose energy is greater than the energy of at least a portion of the photoluminesced light.

16. The composition of claim 15, wherein the core comprises a material independently selected from the group consisting of CdS, CdSe, CdTe, ZnS, ZnSe, ZnTe, GaAs, GaP, GaAs, GaSb, HgS, HgSe, HgTe, InAs, InP, InSb, AlAs, AlP, AlSb, alloys thereof, and mixtures thereof.

17. The composition of claim 16, wherein the QDs further comprise a core overcoat comprising a material independently selected from the group consisting ZnO, ZnS, ZnSe, ZnTe, CdO, CdS, CdSe, CdTe, MgS, MgSe, GaAs, GaN, GaP, GaAs, GaSb, HgO, HgS, HgSe, HgTe, InAs InN, InP, InSb, AlAs, AlN, AlP, AlSb, alloys thereof, and mixtures thereof.

18. The composition of claim 17, wherein the overcoated core further comprise a coat comprising a material having an affinity for the host matrix.

19. The composition of claim 15, wherein the host matrix comprises a material selected from the group consisting of liquids, polymers, epoxies, a silica glass, a silica gel and a combination thereof.

20. The composition of claim 15, wherein the host matrix comprises a polymer selected from the group consisting of polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxies, silica glass, silica gel, siloxane, polyphosphate, hydrogel, agarose, and cellulose.

21. The composition of claim 15, wherein the QDs further comprise a core coat comprising a material having an affinity for the host matrix.

22. The composition of claim 21, wherein the host matrix comprises a polymer and the coat material comprises a related monomer.

23. The composition of claim 15, wherein the population of QDs has a size distribution having less than a 10% rms deviation in diameter of the core.

24. A prepolymer composition, comprising:
a precursor material capable of being reacted to form a solid host matrix that allows light to pass therethrough; and
a population of quantum dots (QDs) dispersed in the precursor material without substantial flocculation, wherein each QD of the population comprises a core of an independently selected size and composition, and the population comprises a selected size distribution of QDs.

25. The composition of claim 24, wherein the precursor material is a monomer capable of being reacted to form a polymer.

26. The composition of claim 25, wherein the precursor material comprises a monomer selected from the group consisting of acrylics, imides, acrylamides, ethylenes, vinylenes, diacetylenes, phenylene-vinylenes, peptides, saccharides, sulfones, pyrroles, imidazoles, thiophenes, ethers, epoxides, silanes, phosphates, styrenes, acids, peroxides, anhydrides, amines, and alcohols.

27. The composition of claim 24, wherein the core comprises a material independently selected from the group consisting of CdS, CdSe, CdTe, ZnS, ZnSe, ZnTe, GaAs, GaP, GaAs, GaSb, HgS, HgSe, HgTe, InAs, InP, InSb, AlAs, AlP, AlSb, alloys thereof, and mixtures thereof.

28. The composition of claim 27, wherein the QDs further comprise a core overcoat comprising a material selected from the group consisting of ZnO, ZnS, ZnSe, ZnTe, CdO, CdS, CdSe, CdTe, MgS, MgSe, GaAs, GaN, GaP, GaAs, GaSb, HgO, HgS, HgSc, HgTe, InAs, InN, InP, InSb, AlAs, AlN, AlP, AlSb, alloys thereof, and mixtures thereof.

29. The composition of claim 24, wherein the QDs further comprise a core coat comprising a material having an affinity for the precursor material.

30. The composition of claim 28, wherein the overcoated core further comprises a coat comprising a material having an affinity for the precursor material.

31. The composition of claim 30, wherein the overcoated core further comprises a coat that is a material that is a related monomer to the polymer formed from the precursor material.

32. The composition of claim 24, wherein the population of QDs has a size distribution having less than a 10% rms deviation in diameter of the core.

33. A method of producing light of a selected color, comprising:
(a) providing a population of quantum dots (QDs), wherein each QD of the population comprises a core of an independently selected size and composition, the population comprises a selected size distribution of QDs, and the QDs have a surface adapted to allow the QDs to be dispersed in a host matrix;
(b) dispersing the QDs in the host matrix without substantial flocculation; and
(c) illuminating the QDs disposed in the host matrix with primary light of an energy greater than the characteristic band gap energy of at least a portion of the QDs, whereby the selected color is photoluminescent light emitted by the QDs, light transmitted from the primary light source through the host matrix or a combination thereof.

34. The method of claim 33, wherein the host matrix allows photoluminescent light emitted by the QDs to pass therethrough.

35. The method of claim 34, wherein the photoluminescent light emitted by the QDs is detected.

36. The method of claim 33, wherein the light of the selected color is the photoluminescent light emitted by the QD.

37. The method of claim 33, wherein the core comprises a material independently selected from the group consisting of CdS, CdSe, CdTe, ZnS, ZnSe, ZnTe, GaAs, GaP, GaAs, GaSb, HgS, HgSe, HgTe, InAs, InP, InSb, AlAs, AlP, AlSb, alloys thereof, and mixtures thereof.

38. The method of claim 33, wherein step (a) further comprises coating the core with an overcoat.

39. The method of claim 38, wherein the core overcoat comprises a material independently selected from the group consisting of ZnO, ZnS, ZnSe, ZnTe, CdO, CdS, CdSe, CdTe, MgS, MgSe, GaAs, GaN, GaP, GaAs, GaSb, HgO, HgS, HgSe, HgTe, InAs, InN, InP, InSb, AlAs, AlN, AlP, AlSb, alloys thereof, and mixtures thereof.

40. The method of claim 38, wherein step (a) further comprises coating the QDs with a coat material having an affinity for the host matrix.

41. The method of claim 38, wherein step (a) further comprises coating the overcoated core with a coat material having an affinity for the host matrix.

42. The method of claim 33, wherein step (a) comprises,
(i) providing a precursor material having QDs disposed therein; and
(ii) reacting the precursor material to form a solid host matrix having QDs disposed therein.

43. The method of claim 33, wherein the host matrix comprises at least one material selected from the group consisting of polymers, epoxies, silica glasses, and silica gels.

44. The method of claim 33, wherein the host matrix comprises a polymer selected from the group consisting of polyacrylate, polystyrene, polyimide, polyacrylamide, polyethylene, polyvinyl, poly-diacetylene, polyphenylene-vinylene, polypeptide, polysaccharide, polysulfone, polypyrrole, polyimidazole, polythiophene, polyether, epoxies, silica glass, silica gel, siloxane, polyphosphate, hydrogel, agarose, and cellulose.

45. A method of producing light of a selected color, comprising:
(a) providing a population of quantum dots (ODs), wherein each OD of the population comprises a core of an independently selected size and composition, the population comprises a selected size distribution of ODs, and the ODs have a surface adapted to allow the ODs to be dispersed in a host matrix;
(b) dispersing the ODs in the host matrix; and
(c) illuminating the ODs disposed in the host matrix with primary light of an energy greater than the characteristic band gap energy of at least a portion of the ODs, whereby the selected color is photoluminescent light emitted by the ODs, light transmitted from the Primary light source through the host matrix or a combination thereof:
and wherein the host matrix allows light produced by the light source and photoluminescent light emitted by the QDs to pass therethrough.

46. The method of claim 45, wherein the photoluminescent light emitted by the QDs is detected.

47. The method of claim 45, wherein both the light produced by the light source and the photoluminescent light emitted by the QDs are detected.

48. The method of claim 45, wherein the light of the selected color is the photoluminescent light emitted by the QD.

49. The method of claim 45, wherein the light of the selected color is the combination of photoluminescent light emitted by the QDs and light transmitted from the primary light source through the host matrix.

50. A method of producing light of a selected color, comprising:
  (a) providing a population of guantum dots (ODs), wherein each OD of the population comprises a core of an independently selected size and composition, the population comprises a selected size distribution of ODs, and the ODs have a surface adapted to allow the ODs to be dispersed in a host matrix;
  (b) dispersing the ODs in the host matrix; and
  (c) illuminating the ODs disposed in the host matrix with primary light of an energy greater than the characteristic band gap energy of at least a portion of the ODs.
  wherein the light of the selected color is the combination of photoluminescent light emitted by the QDs and light transmitted from the primary light source through the host matrix.

51. A method of producing light of a selected color, comprising:
  (a) providing a population of quantum dots (ODs), wherein each OD of the population comprises a core of an independently selected size and composition, the population comprises a selected size distribution of ODs, and the ODs have a surface adapted to allow the ODs to be dispersed in a host matrix;
  (b) dispersing the ODs in the host matrix; and
  (c) illuminating the ODs disposed in the host matrix with primary light of an energy greater than the characteristic band gap energy of at least a portion of the ODs,
  whereby the selected color is photoluminescent light emitted by the ODs, light transmitted from the primary light source through the host matrix or a combination thereof;
  and wherein step (a) comprises,
    (i) providing at least two precursor materials, wherein each precursor material has disposed therein a population of QDs having a size, size distribution, composition or combination thereof, selected to be different from that of the population of QDs in any of the other precursor materials,
    (ii) combining the precursor materials, and
    (iii) reacting the precursor materials to form a solid host matrix having QDs disposed therein.

52. The method of claim 51, wherein first and second precursor materials are provided, and further wherein the first precursor material has a first population of QDs having a first size, size distribution, composition or combination thereof disposed therein and the second precursor material has a second population of QDs having a second size, size distribution, composition or combination thereof disposed therein.

53. The method of claim 51, wherein step (ii) comprises admixing the precursor materials.

54. A method of producing light of a selected color, comprising:
  (a) providing a population of quantum dots (QDs), wherein each QD of the population comprises a core of an independently selected size and composition, the population comprises a selected size distribution of ODs, and the ODs have a surface adapted to allow the ODs to be dispersed in a host matrix;
  (b) dispersing the QDs in the host matrix; and
  (c) illuminating the ODs disposed in the host matrix with Primary light of an energy greater than the characteristic band gap energy of at least a portion of the ODs,
  whereby the selected color is photoluminescent light emitted by the QDs, light transmitted from the primary light source through the host matrix or a combination thereof;
  and wherein step (a) comprises,
    (i) providing at least two precursor materials, wherein each precursor material has disposed therein a population of QDs having a size, size distribution, composition or combination thereof, selected to be different from that of the population of QDs in any of the other precursor materials,
    (ii) forming a layer of a precursor material;
    (iii) reacting the layer of precursor material to form a solid host matrix layer having QDs disposed therein; and
    (iv) repeating steps (ii) and (iii) on the solid host matrix layer formed in step (iii).

55. The method of claim 54, wherein step (iv) comprises repeating steps (ii) and (iii) with the same precursor material.

56. The method of claim 54, wherein step (iv) comprises repeating steps (ii) and (iii) with a different precursor material.

* * * * *

UNITED STATES PATENT AND TRADEMARK OFFICE
CERTIFICATE OF CORRECTION

PATENT NO. : 6,803,719 B1
DATED : October 12, 2004
INVENTOR(S) : Miller et al.

It is certified that error appears in the above-identified patent and that said Letters Patent is hereby corrected as shown below:

Title page,
Item [75], Inventors, please correct the spelling of the third inventor as follows:
-- Moungi G. Bawendi --.
Item [73], Assignee, should read -- Massachusetts Institute of Technology and Lumileds Lighting U.S., LLC --

Signed and Sealed this

Eighth Day of February, 2005

JON W. DUDAS
*Director of the United States Patent and Trademark Office*